(12) United States Patent
Tsao et al.

(10) Patent No.: US 9,748,911 B2
(45) Date of Patent: Aug. 29, 2017

(54) VARIABLE GAIN AMPLIFYING CIRCUIT

(71) Applicant: Elite Semiconductor Memory Technology Inc., Hsinchu (TW)

(72) Inventors: Szu-chun Tsao, Su'ao Township, Yilan County (TW); Deng-Yao Shih, Changhua (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 14/990,836

(22) Filed: Jan. 8, 2016

(65) Prior Publication Data

US 2017/0201220 A1 Jul. 13, 2017

(51) Int. Cl.
*H03G 3/30* (2006.01)
*H03F 3/45* (2006.01)
*H03G 1/00* (2006.01)
*H03F 1/12* (2006.01)

(52) U.S. Cl.
CPC ........... *H03G 3/30* (2013.01); *H03F 3/45179* (2013.01); *H03F 1/12* (2013.01); *H03F 2203/45112* (2013.01); *H03F 2203/45116* (2013.01); *H03G 1/0023* (2013.01)

(58) Field of Classification Search
CPC .... H03F 3/45; H03F 3/45179; H03F 3/45183; H03F 3/45188; H03F 3/45192; H03F 2200/177; H03G 1/0023; H03G 1/0088; H03G 3/30; H03G 3/301; H03G 1/0005; H03G 3/001; H03G 3/004; H03G 1/00
USPC ........ 330/254, 278, 279, 282, 284, 285, 296
See application file for complete search history.

(56) References Cited

U.S. PATENT DOCUMENTS

| | | | |
|---|---|---|---|
| 5,726,600 A * | 3/1998 | Raghavan | H03H 11/0472 327/103 |
| 9,337,792 B1 * | 5/2016 | Shou | H03G 1/0029 |
| 2010/0141340 A1 * | 6/2010 | Huang | H03F 3/45197 330/253 |

\* cited by examiner

*Primary Examiner* — Khanh V Nguyen
(74) *Attorney, Agent, or Firm* — Juan Carlos A. Marquez; Marquez IP Law Office, PLLC

(57) ABSTRACT

A variable gain amplifying circuit incorporates an operational amplifier, an input device, a feedback device, a transconductance circuit, and a dynamic biasing circuit. The operational amplifier has an output terminal providing an amplified difference output signal. The input device has a first terminal receiving a first input signal, and a second terminal coupled to a first input terminal of the operational amplifier. The feedback device is coupled between the first input terminal of the operational amplifier and the output terminal of the operational amplifier. The dynamic biasing circuit generates a bias current according to a set value. The transconductance circuit converts the difference between the first input signal and a second input signal into an analog output current flowing through the feedback device. The analog output current of the transconductance circuit is varied according to the bias current.

12 Claims, 9 Drawing Sheets

VARIABLE GAIN AMPLIFYING CIRCUIT

BACKGROUND OF THE INVENTION

1. Field of the Invention

The present invention relates generally to variable gain amplifying circuits.

2. Description of the Related Art

A variable gain amplifying circuit is used to amplify or attenuate an input signal according to a gain controlled by a gain controller. FIG. 1 illustrates a prior art variable gain amplifying circuit 100. Referring to FIG. 1, the variable gain amplifying circuit 100 includes a differential operational amplifier 12, fixed resistors R1A and R1B, and variable resistors R2A and R2B.

Referring to FIG. 1, each of the variable resistors R2A and R2B has a plurality of circuits, each having a fixed resistor and a MOSFET serving as a switch connected in series, are connected in parallel. A gain controller 14 generates several logic signals to input into the MOSFETs in the variable resistors R2A and a gain controller 16 generates several logic signals to input into the MOSFETs in the variable resistors R2B, respectively. A combined resistance of the variable resistor R2A or R2B is determined by turning on or turning off the respective MOSFETs, so that the resistances of the resistors R2A and R2B are determined. In this manner, the total gain of the variable gain amplifying circuit 100 is determined.

As known, the gain of the variable gain amplifying circuit 100 is determined according to the ratio of the feedback resistance to the input resistance. Therefore, if N gain steps are required, each of the variable resistors R2A and R2B requires N MOSFETs connected to N fixed resistors. As a result, the chip area of the variable gain amplifying circuit 100 increases as the increase of the number of N.

SUMMARY OF THE INVENTION

An aspect of the present invention is to provide a variable gain amplifying circuit for amplifying a difference between a first input signal and a second input signal to generate an amplified difference output signal. According to one embodiment of the present invention, the variable gain amplifying circuit comprises an operational amplifier, an input device, a feedback device, a transconductance circuit, and a dynamic biasing circuit. The operational amplifier has a first input terminal, a second input terminal, and an output terminal providing the amplified difference output signal. The input device has a first terminal receiving the first input signal, and a second terminal coupled to the first input terminal of the operational amplifier. The feedback device has a first terminal coupled to the first input terminal of the operational amplifier, and has a second terminal coupled to the output terminal of the operational amplifier. The dynamic biasing circuit generates a bias current according to a set value. The transconductance circuit converts the difference between the first input signal and the second input signal into an analog output current flowing through the feedback device. The analog output current of the transconductance circuit is varied according to the bias current.

BRIEF DESCRIPTION OF THE DRAWINGS

The invention will be described according to the appended drawings in which.

DETAILED DESCRIPTION OF THE INVENTION

Figure 1:
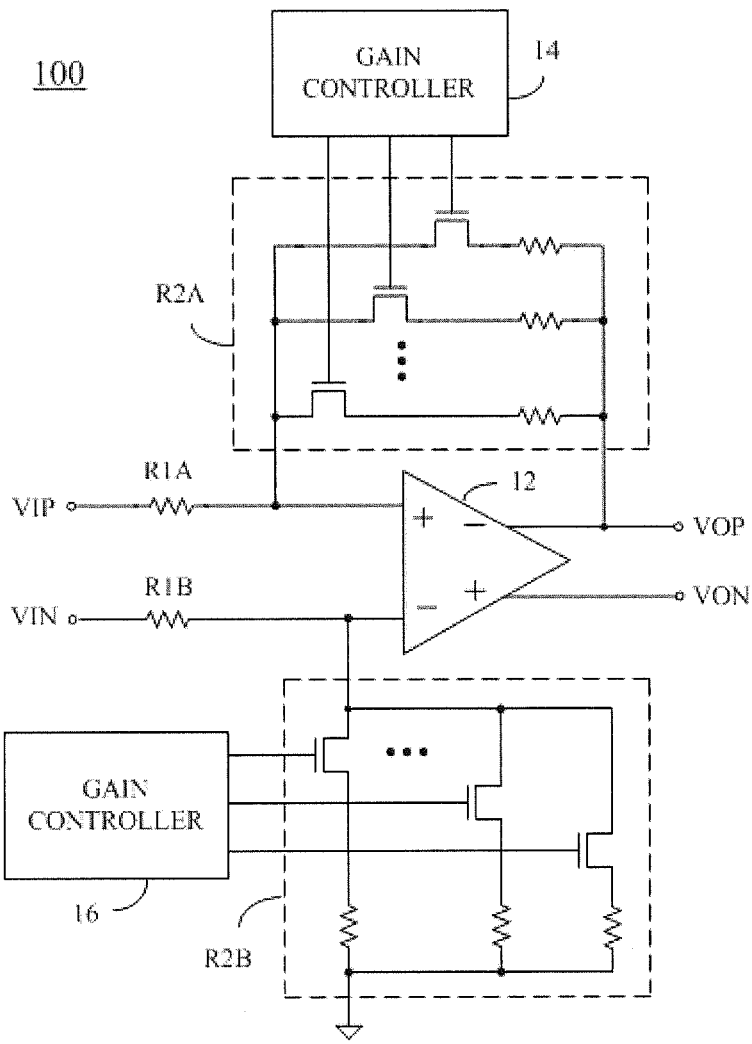
FIG. 1 illustrates a prior art variable gain amplifying circuit.
Figure 2:
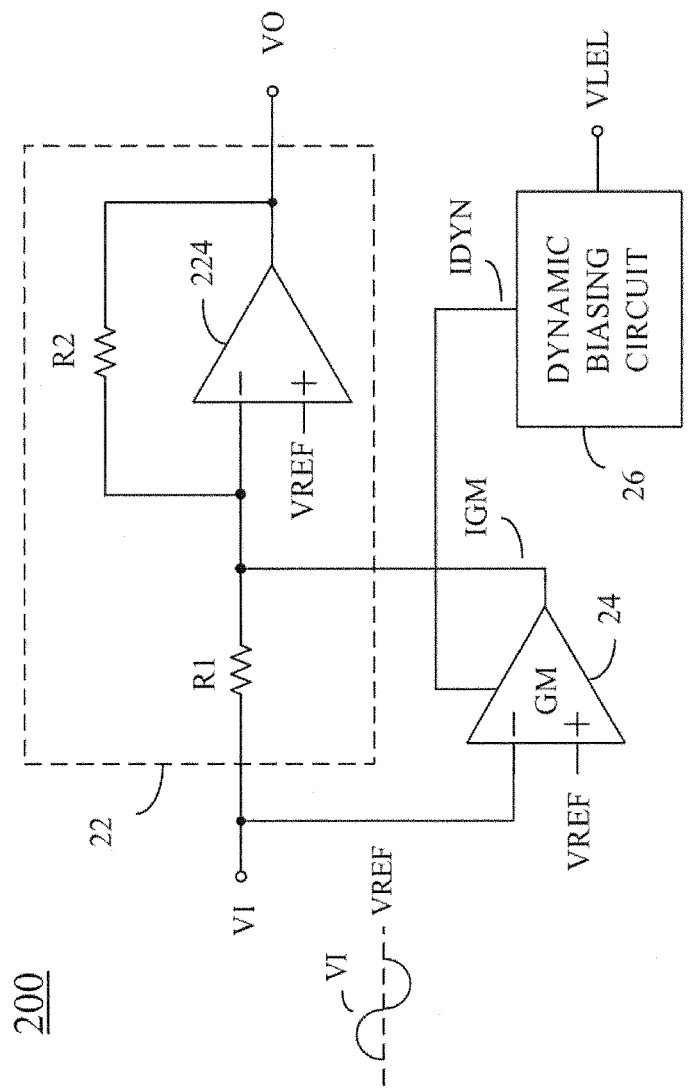
FIG. 2 shows a block diagram of a variable gain amplifying circuit according to one embodiment of the present invention.

FIG. 2 shows a block diagram of a variable gain amplifying circuit 200 according to one embodiment of the present invention. Referring to FIG. 2, the variable gain amplifying circuit 200 includes a gain amplifier 22, a transconductance circuit 24, and a dynamic biasing circuit 26.

The gain amplifier 22 receives an analog input signal VI to generate an analog output signal VO. In one embodiment of the present invention, the gain amplifier 22 is composed of a single-input single-output amplifier 224, a fixed input resistor R1, and a fixed feedback resistor R2. An initial gain G of the gain amplifier 22 shown in FIG. 2 without externally injecting current from the transconductance circuit 24 can be expresses as:

$$G = R2/R1 \qquad (1)$$

However, a new gain G' of the gain amplifier 22 can be obtained by varying the net current flowing through the feedback resistor R2. Referring to FIG. 2, the transconductance circuit 24 is configured to convert the difference between an input signal VI and a reference voltage VREF into an analog output current IGM. Thereafter, the transconductance circuit 24 provides the current IGM to the gain amplifier 22 to adjust the gain G' of the gain amplifier 22. Note that a bias current IDYN of the transconductance circuit 24 comes from the dynamic biasing circuit 26. The bias current IDYN of the transconductance circuit 24 can be varied according to an input signal VLEL.

Figure 3:
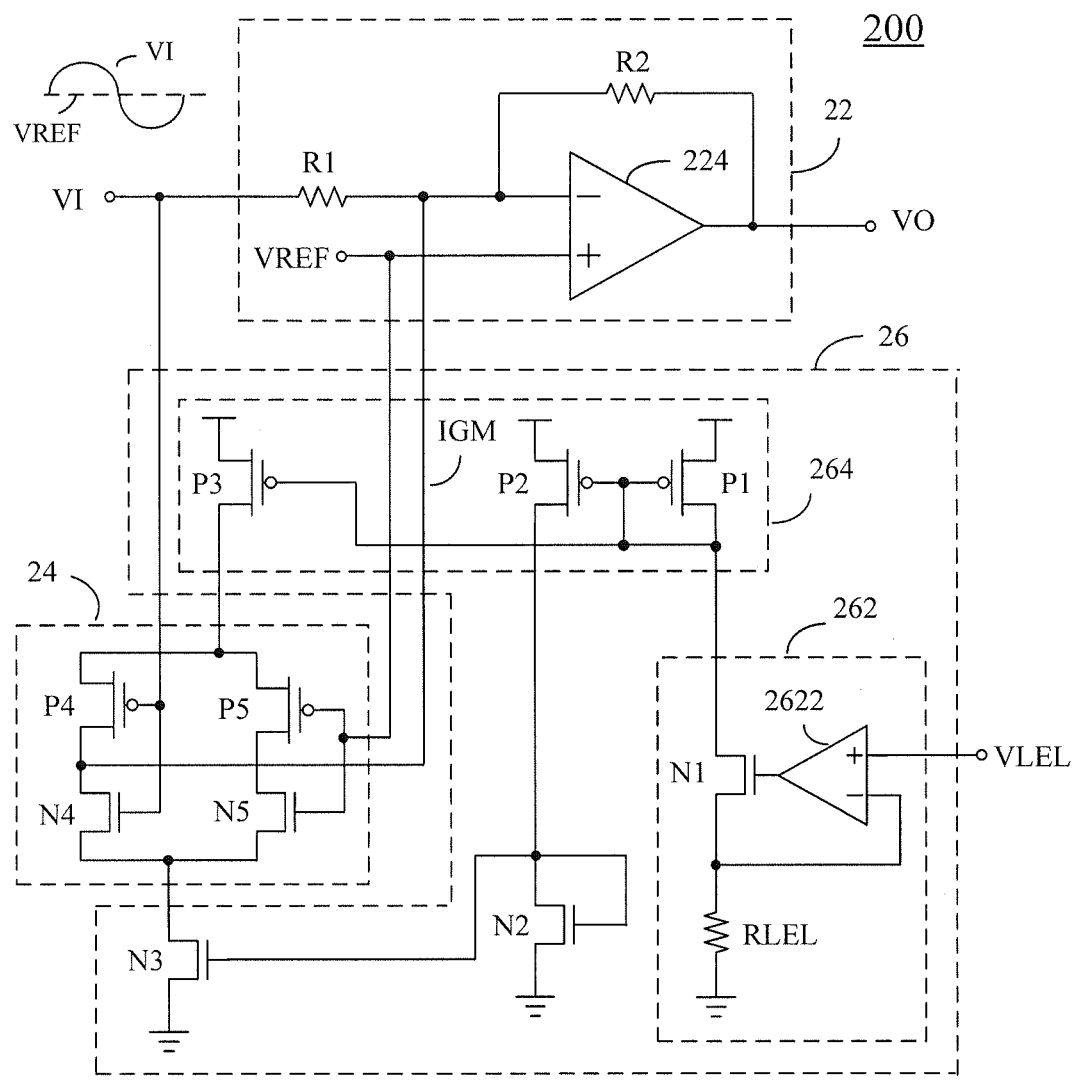
FIG. 3 illustrates a detailed circuit diagram of the variable gain amplifying circuit shown in FIG. 2 according to one embodiment of the present invention.

FIG. 3 illustrates a detailed circuit diagram of the variable gain amplifying circuit 200 shown in FIG. 2 according to one embodiment of the present invention. Referring to FIG. 3, the dynamic biasing circuit 26 includes a current generator 262 and a current mirror 264. In this embodiment, the current generator 262 is composed of an operational amplifier 2622, a NMOS transistor N1, and a resistor RLEL. The operational amplifier 2622 has a positive input terminal receiving the input signal VLEL, a negative input terminal coupled to the resistor RLEL, and an output terminal coupled to a gate of the NMOS transistor N1. In this manner, the current flowing through the NMOS transistor N1 is equal to the value of the input signal VLEL divided by the resistance of the resistor RLEL.

Referring to FIG. 3, the current mirror 264 is formed by three PMOS transistors P1, P2, and P3. The PMOS transistor P1 receives the current flowing through the NMOS transistor N1, and the PMOS transistors P2 and P3 generate currents which are proportional to the W/L ratio of the transistors. The current flowing through the PMOS transistor P3 is sent to the transconductance circuit 24 as an upper bias current source. The current flowing through the PMOS transistor P2 is sent to a NMOS transistor N2. The current flowing through the NMOS transistor N3 mirrors the current flowing through the NMOS transistor N2. Then, the current flowing through the NMOS transistor N3 is sent to the transconductance circuit 24 as a down bias current source.

Referring to FIG. 3, the transconductance circuit 24 includes a parallel input transistor pair including PMOS transistors P4 and P5, and NMOS transistors N4 and N5, wherein the PMOS transistor P4 and the NMOS transistor N4 are coupled in series between the upper bias current source and the down bias current source, and the PMOS transistor P5 and the NMOS transistor N5 are coupled in series between the upper bias current source and the down bias current source.

Referring to FIG. 3, the gates of the PMOS transistor P4 and the NMOS transistor N4 receive the analog input signal VI, and the gates of the PMOS transistor P5 and the NMOS transistor N5 receive the reference voltage VREF. Therefore, the output current IGM of the transconductance circuit 24 responds to the difference between the input signal VI and the reference voltage VREF. In addition, the gain of the transconductance circuit 24 is in response to variations in a magnitude of the bias current source.

The detailed operation of the variable gain amplifying circuit 200 will be described below with respect to FIG. 3. As the value of the input signal VLEL increases, the current flowing through the resistor RLEL increases. Because the current mirror 264 functions to produce a copy of the current flowing through the resistor RLEL, the current flowing through the PMOS transistor P3 and the current flowing through the NMOS transistor N3 increases as the value of the input signal VLEL increases. Since the magnitude of the bias current source of the transconductance circuit 24 increases, the output current IGM of the transconductance circuit 24 increases. As a result, the net current flowing through the feedback resistor R2 decreases since the transconductance circuit 24 takes the current flowing through the feedback resistor R2 away when the input signal VI is larger than the reference voltage VREF. In this manner, the gain of the gain amplifier 22 decreases.

Figure 4:
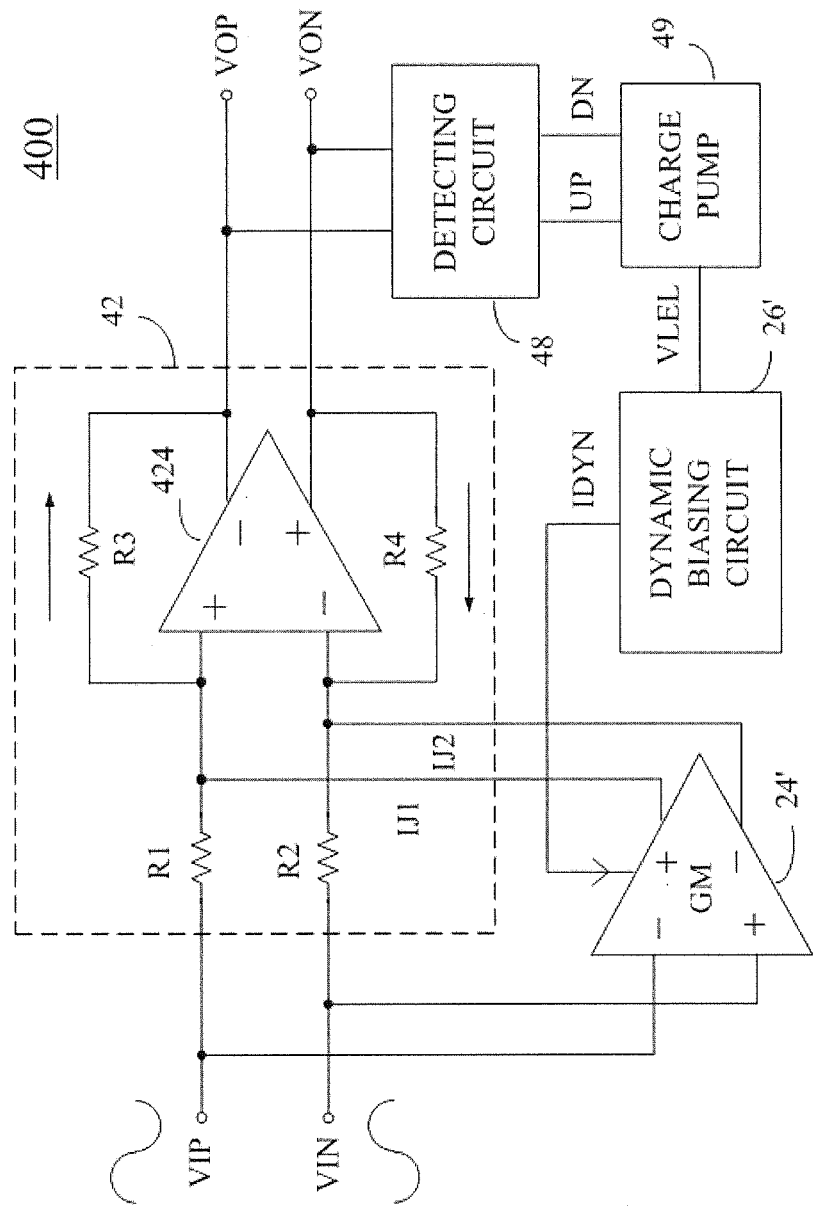
FIG. 4 shows a block diagram of a variable gain amplifying circuit according to another embodiment of the present invention.

FIG. 2 shows an implementation of the variable gain amplifying circuit 200. A single-input single-output amplifier is shown as an example. However, the present invention is not limited to this configuration and many alternative configurations can be used, such as differential input amplifier architecture. FIG. 4 shows a block diagram of a variable gain amplifying circuit 400 according to another embodiment of the present invention. Referring to FIG. 4, the variable gain amplifying circuit 400 includes a gain amplifier 42, a transconductance circuit 24', a dynamic biasing circuit 26', a detecting circuit 48, and a charge pump 49.

The gain amplifier 42 in this embodiment is a differential-input differential-output amplifier. Referring to FIG. 4, the gain amplifier 42 receives complementary analog input signals VIP and VIN to generate complementary analog output signals VOP and VON. In one embodiment of the present invention, the gain amplifier 42 is composed of a differential operational amplifier 424, and four fixed resistors R1, R2, R3, and R4. If the resistance of the resistor R1 is equal to that of the resistor R2, and the resistance of the resistor R3 is equal to that of the resistor R4, a gain G of the gain amplifier 42 shown in FIG. 4 without externally injecting current can be expressed as:

$$G = R3/R1 \qquad (2)$$

In this condition, when the input signal VIP is larger than the input signal VIN, the current flowing through the resistor R3 is from left to right and the current flowing through the resistor R4 is from right to left as indicated by solid lines. As the difference between the input signal VIP and the input signal VIN increases, the current flowing through the feedback resistors R3 and R4 also increases.

Figure 5:
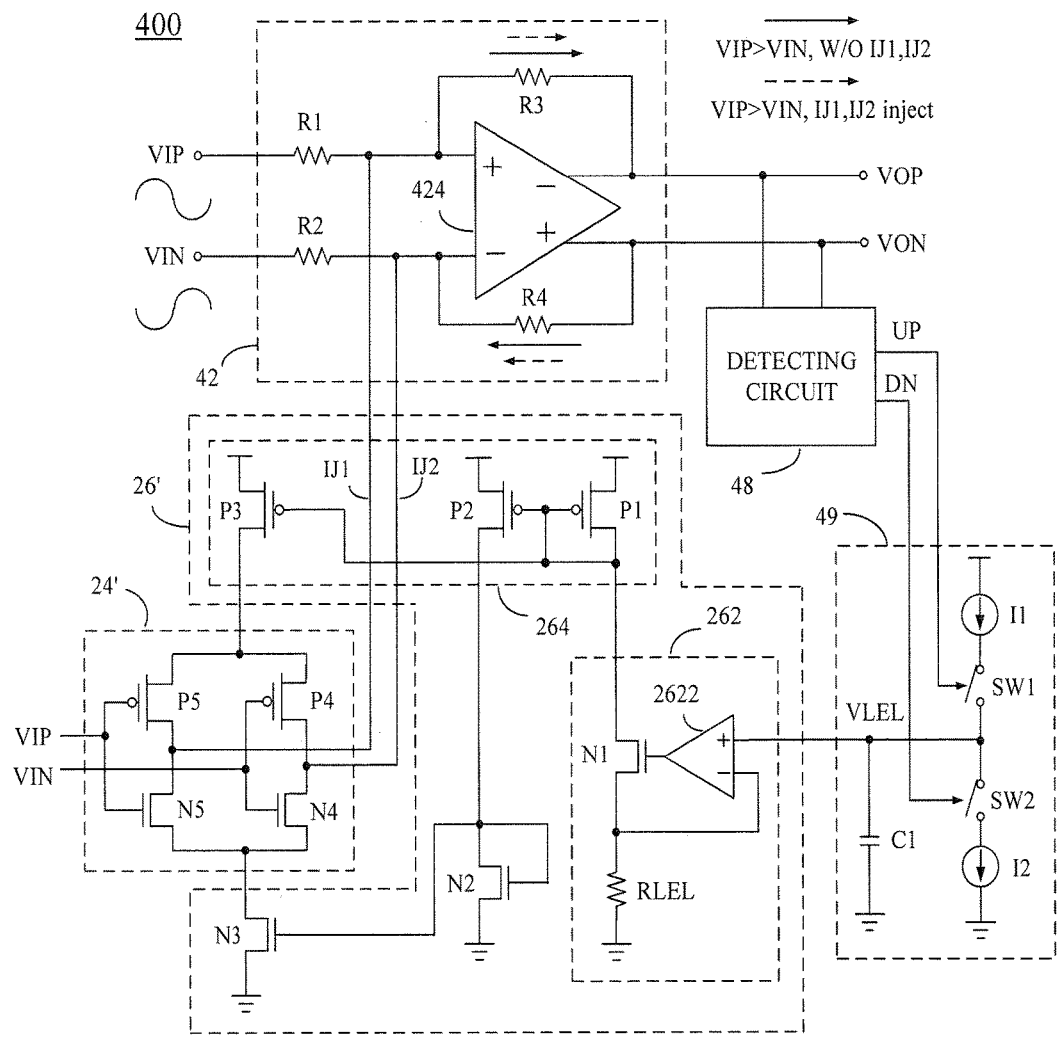
FIG. 5 illustrates a detailed circuit diagram of the variable gain amplifying circuit shown in FIG. 4 according to one embodiment of the present invention.

Referring to FIG. 4, the gain of the gain amplifier 42 can be adjusted when the detecting circuit 48 detects whether the output signals of the gain amplifier 42 are not within a predetermined output range. FIG. 5 illustrates a detailed circuit diagram of the variable gain amplifying circuit 400 shown in FIG. 4 according to one embodiment of the present invention. Circuits having similar functions to those in FIG. 2 are denoted by the same reference numerals and detailed descriptions thereof will be omitted.

The detailed operation of the variable gain amplifying circuit 400 will be described below with respect to FIG. 5. Referring to FIG. 5, if the detecting circuit 48 detects whether the analog output signals VOP and VON of the gain amplifier 42 are not within the predetermined output range, complementary control signals UP and DN are generated and sent to the charge pump 49. The Charge pump 49 is configured to generate the voltage VLEL in response to the status of the complementary control signals DN and UP. Referring to FIG. 5, the charge pump 49 includes an upper current source I1, a down current source I2, two switches SW1 and SW2 coupled in series between the upper current source I1 and the down current source I2, and a capacitor C1.

In response to the control signal UP, the charge pump 49 charges the capacitor C1 to increase the voltage VLEL, and, in response to the control signal DN, the charge pump 49 discharges the capacitor C1 to decrease the voltage VLEL. When the output signals VOP and VON of the gain amplifier 42 are not within the predetermined output range, the charge pump 49 charges the capacitor C1 to increase the voltage VLEL. As the voltage VLEL increases, the PMOS transistor P3 generates larger bias current to the transconductance circuit 24, and thus the currents IJ1 and IJ2 increase. As a result, the net currents flowing through the feedback resistors R3 and R4 decrease. In this manner, the gain of the gain amplifier 42 decreases. Note that the analog output currents currents IJ1 and IJ2 of the transconductance circuit 24' flow in opposite directions. With the decreased gain of the gain amplifier 42, the output signals VOP and VON of the gain amplifier 42 are finally within the predetermined output range, and the voltage VLEL continues to maintains its value.

Figure 6:
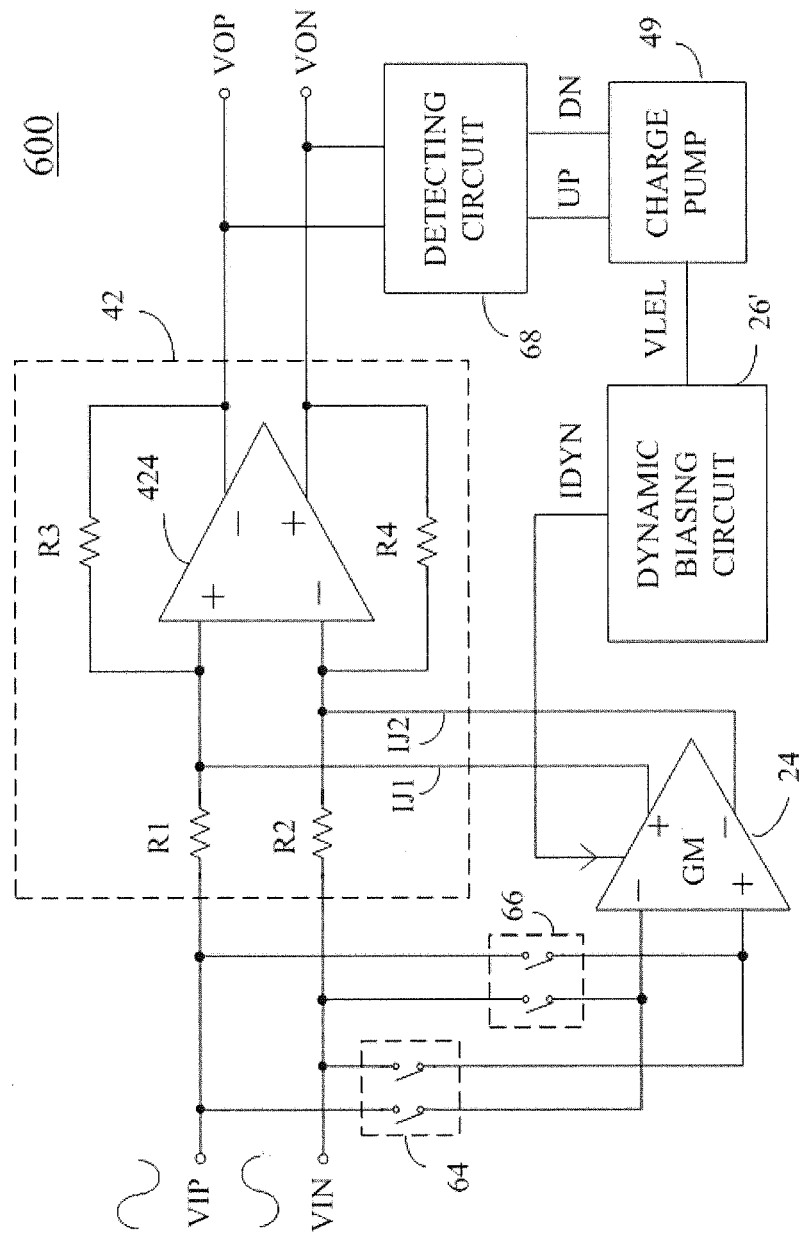
FIG. 6 shows a block diagram of a variable gain amplifying circuit.

Referring to FIG. 2 and FIG. 4, the variable gain amplifying circuits 200 and 400 can be used in many communication and signal processing applications. For example, the variable gain amplifying circuit can be used as a volume controller for amplifying or attenuating an audio input signal. FIG. 6 shows a block diagram of a variable gain amplifying circuit 600 in which the gain of the gain amplifying circuit 600 can be dynamically increased and decreased. Circuits having similar functions to those in FIG. 4 are denoted by the same reference numerals and detailed descriptions thereof will be omitted.

Referring to FIG. 6, the variable gain amplifying circuit 600 includes a gain amplifier 42, a transconductance circuit 24', a switch unit 64, a switch unit 66, a dynamic biasing circuit 26', a detecting circuit 68, and a charge pump 49. The operation of the variable gain amplifying circuit 600 is described below. If the detecting circuit 68 detects whether the analog output signals VOP and VON of the gain amplifier 42 are not within a higher output range (e.g. 4V), the switches in the switch unit 64 turn on and the switches in the switch unit 66 turn off. Therefore, the transconductance circuit 24' provides output currents IJ1 and IJ2 to the gain amplifier 42 in response to the difference between the input signal VIP and the input signal VIN. Thereafter, the charge pump 49 charges the capacitor C1 to increase the voltage VLEL since the output signals VOP and VON of the gain amplifier 42 are not within the first preset output range. As the voltage VLEL increases, the net currents flowing through the feedback resistors R3 and R4 decrease. In this manner, the gain of the gain amplifying circuit 600 decreases.

Figure 7:
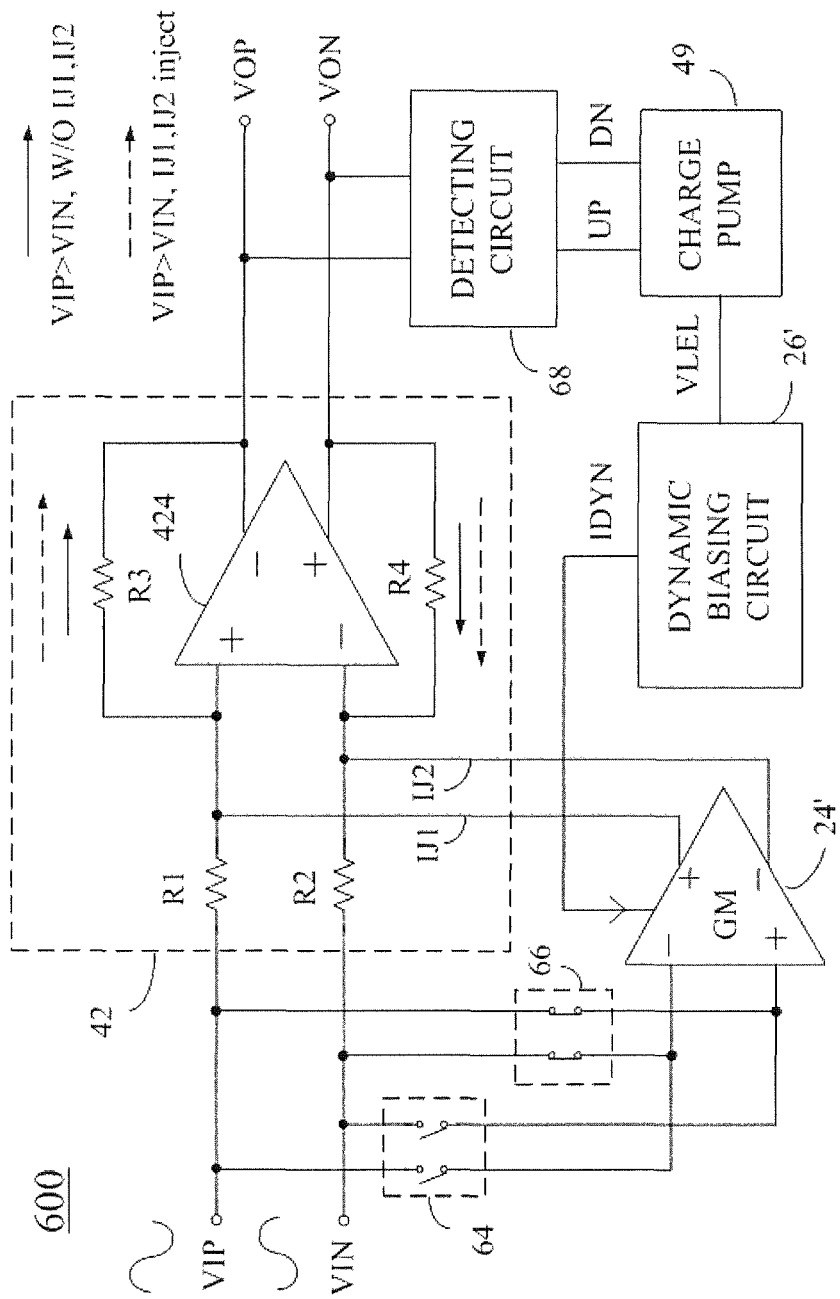
FIG. 7 shows the operation of the variable gain amplifying circuit.

On the contrary, if the detecting circuit 68 detects whether the analog output signals VOP and VON of the gain amplifier 42 are within a lower output range (e.g. 0.5V), the switches in the switch unit 64 turn off and the switches in the switch unit 66 turn on. Therefore, the transconductance circuit 24' provides output currents IJ1 and IJ2 to the gain amplifier 42 in response to the difference between the input signal VIN and the input signal VIP. In this condition, the voltage VLEL increases, so that the net currents flowing through the feedback resistors R3 and R4 increase as shown in FIG. 7. Therefore, the gain of the gain amplifying circuit 600 increases.

Figure 8:
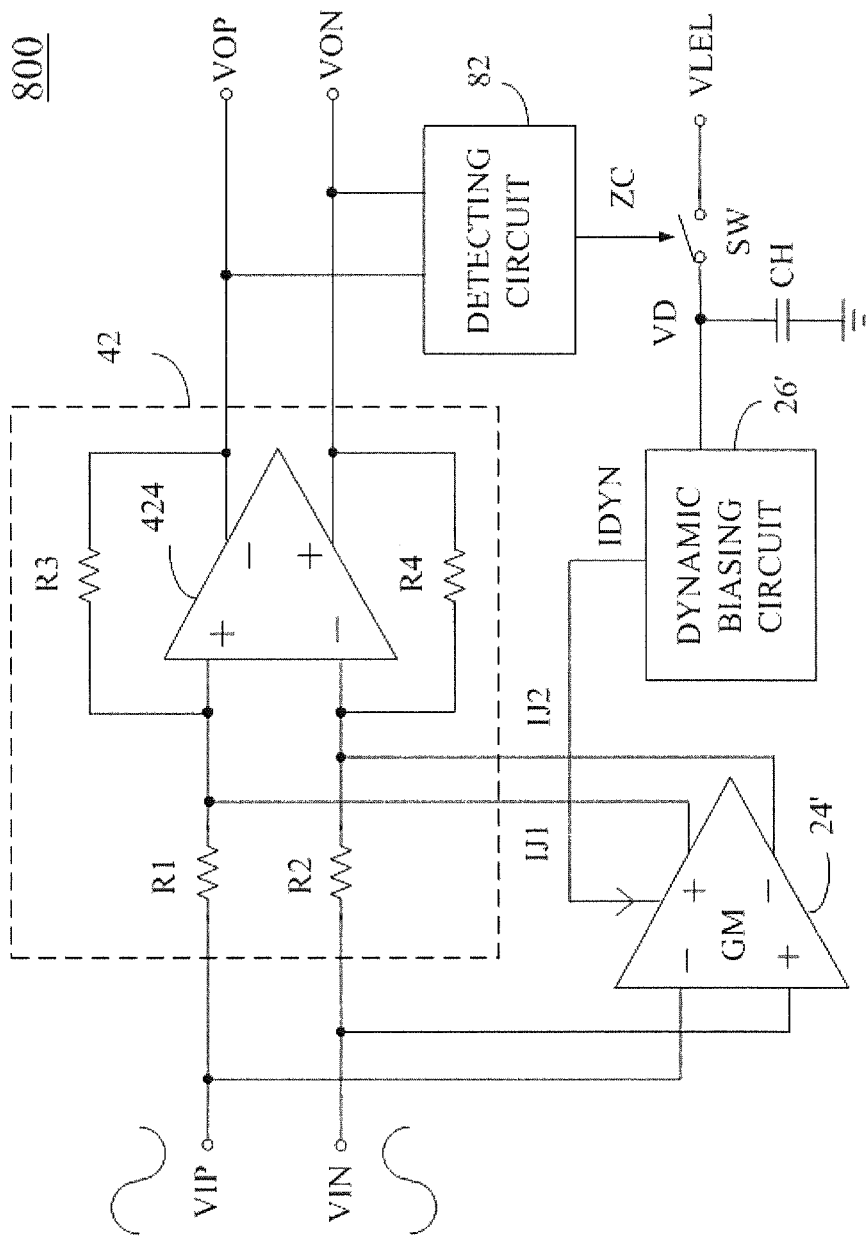
FIG. 8 shows a block diagram of a variable gain amplifying circuit according to yet another embodiment of the present invention.

FIG. 8 shows a block diagram of a variable gain amplifying circuit 800 according to yet another embodiment of the present invention. Referring to FIG. 8, the variable gain amplifying circuit 800 includes a gain amplifier 42, a transconductance circuit 24', a dynamic biasing circuit 26', a detecting circuit 72, a switch SW, and a capacitor CH. The variable gain amplifying circuit 200 shown in FIG. 2 and the variable gain amplifying circuit 400 shown in FIG. 4 do not allow gain changes to be constrained to zero-crossings. Therefore, even though gain changes are ramped in small steps by injecting the small current IGM to the gain amplifier 22 or by injecting the small currents IJ1 and IJ2 to the gain amplifier 42, such gain changes can occur during the analog input signal peaks, which results in audible transients. The audible transients are unacceptable in high quality audio circuits. To eliminate this problem, the variable gain amplifying circuit 800 further includes a detecting circuit to detect a zero crossing of the analog input signal or the analog output signal.

Figure 9:
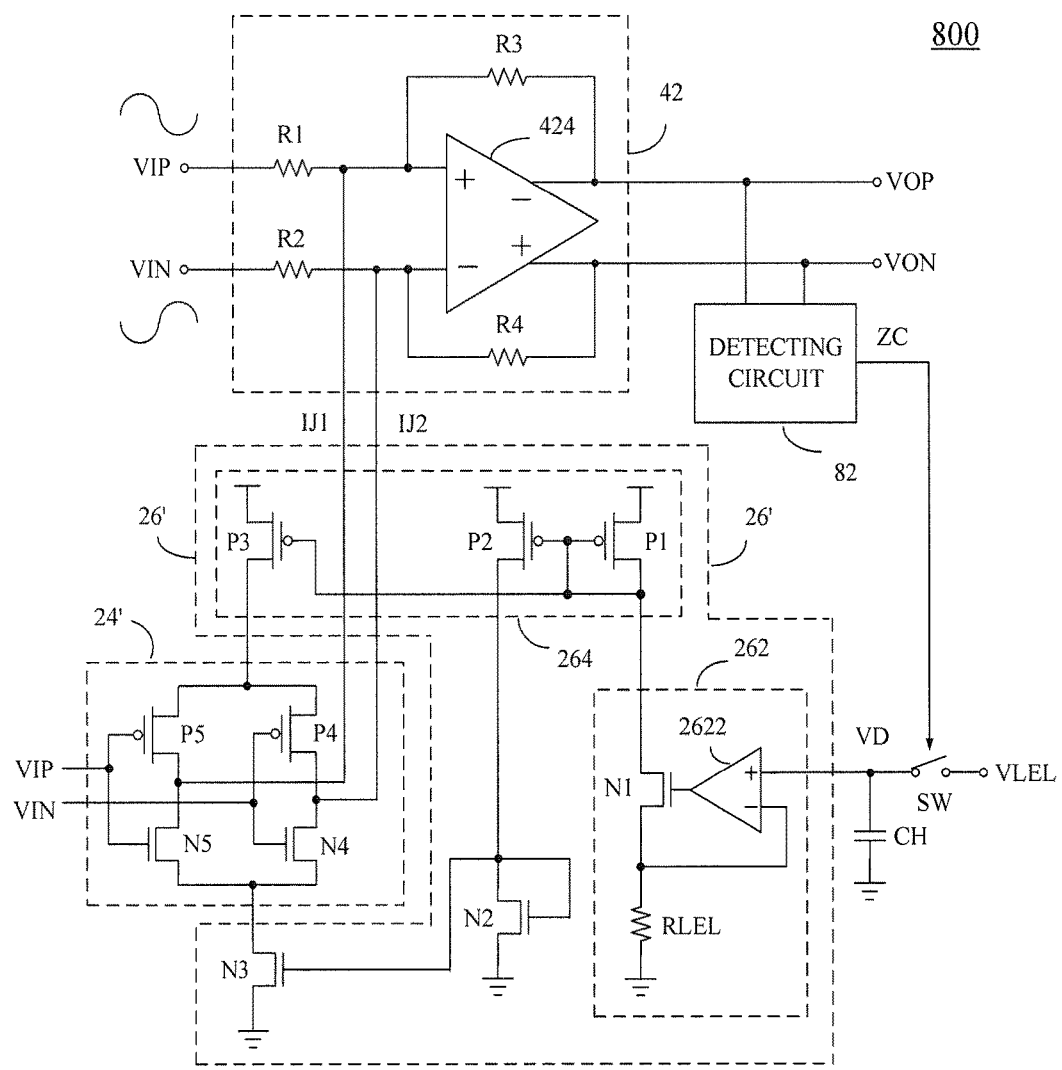
FIG. 9 illustrates a detailed circuit diagram of the variable gain amplifying circuit shown in FIG. 8.

FIG. 9 illustrates a detailed circuit diagram of the variable gain amplifying circuit 800 shown in FIG. 8 according to one embodiment of the present invention. Circuits having similar functions to those in FIG. 5 are denoted by the same reference numerals and detailed descriptions thereof will be omitted. Referring to FIG. 9, in this embodiment, the variable gain amplifying circuit 800 includes the detecting circuit 82 which receives the complementary analog output signals VOP and VON and generates a zero crossing output ZC upon detection of zero crossings of the output signals VOP and VON, i.e., the signal waveform changing from a positive to negative value or vice versa. Therefore, the switch SW closes only when the zero crossings of the output signals VOP and VON are detected, which causes a voltage VD generated at the capacitor CH is substantially equal to the input signal VLEL. Then, the dynamic biasing circuit 26' generates the bias current to the transconductance circuit 24' according to the voltage VD. As a result, the gain amplifier 42 amplifies the difference between the analog input signals VIP and VIN after the zero crossing point is detected, so that the audible transients can be limited to an acceptable range.

The above-described embodiments of the present invention are intended to be illustrative only. Numerous alternative embodiments may be devised by those skilled in the art without departing from the spirit and scope of the invention as recited in the following claims.

What is claimed is:

1. A variable gain amplifying circuit for amplifying a difference between a first input signal and a second input signal to generate an amplified difference output signal, comprising:
    an operational amplifier having a first input terminal, a second input terminal, and an output terminal providing the amplified difference output signal;
    an input device having a first terminal receiving the first input signal, and a second terminal coupled to the first input terminal of the operational amplifier; and
    a feedback device having a first terminal coupled to the first input terminal of the operational amplifier, and a second terminal coupled to the output terminal of the operational amplifier;
    a dynamic biasing circuit for generating a bias current according to a set value; and
    a transconductance circuit for converting the difference between the first input signal and the second input signal into an analog output current flowing through the feedback device;
    wherein the input device has a constant resistance and the feedback device has a constant resistance; and
    wherein the analog output current of the transconductance circuit is varied according to the bias current.

2. The variable gain amplifying circuit of claim 1, further comprising:
    a detecting circuit for generating a first detecting signal when the amplified difference output signal is larger than a first preset value; and
    a charge pump for generating the set value according to the first detecting signal.

3. The variable gain amplifying circuit of claim 1, wherein when the set value increases, the bias current increases, so that the analog output current increases to cause a net current flowing through the feedback device decreases.

4. The variable gain amplifying circuit of claim 2, wherein when the amplified difference output signal is larger than the first preset value, the set value increases, so that the bias current increases to cause the analog output current increase so as to decrease a net current flowing through the feedback device.

5. The variable gain amplifying circuit of claim 2, wherein the detecting circuit generates a second detecting signal when the amplified difference output signal is smaller than a second preset value, and the charge pump generates the set value according to the second detecting signal, wherein a level of the first preset value is larger than a level of the second preset value.

6. The variable gain amplifying circuit of claim 5, wherein when the amplified difference output signal is smaller than the second preset value, the set value increases, so that a net current flowing through the feedback device increases.

7. The variable gain amplifying circuit of claim 1, wherein the dynamic biasing circuit comprises:

a current generator having an input terminal receiving the set value, and an output terminal generating an output current having a current value that varies according to the set value, and a current mirror configured to receive the output current of the current generator, and generate the bias current.

8. The variable gain amplifying circuit of claim 1, wherein the transconductance circuit comprises:

a first PMOS transistor and a first NMOS transistor coupled in series between a first node and a second node, and a second PMOS transistor and a second NMOS transistor coupled in series between the first node and the second node, wherein the first node is configured to receive the bias current;

wherein each of the first PMOS transistor and the first NMOS transistor has a gate receiving the first input signal wherein each of the second PMOS transistor and the second NMOS transistor has a gate receiving the second input signal; and wherein the analog output current is generated at a cross point of the first PMOS transistor and the first NMOS transistor.

9. The variable gain amplifying circuit of claim 1, further comprising:

a detecting circuit configured to receive the amplified difference output signal, and generate a zero crossing output signal upon detection of a zero crossing of the amplified difference output signal; and a switch configured to close or open based on the zero crossing output signal;

wherein the dynamic biasing circuit is configured to receive the set value when the switch is closed.

10. The variable gain amplifying circuit of claim 1, further comprising:

a detecting circuit configured to receive the one of the first input signal and the second input signal, and generate a zero crossing output signal upon detection of a zero crossing of the one of the first input signal and the second input signal; and a switch configured to close or open based on the zero crossing output signal;

wherein the dynamic biasing circuit is configured to receive the set value when the switch is closed.

11. The variable gain amplifying circuit of claim 1, wherein the operational amplifier is a single-input single-output amplifier, and the second input terminal of the operational amplifier receives a reference voltage.

12. The variable gain amplifying circuit of claim 1, wherein the operational amplifier is a differential-input differential-output amplifier, and a second input device is coupled between the second input signal and the second input terminal of the operational amplifier.

* * * * *